(12) United States Patent
Huang et al.

(10) Patent No.: US 10,317,462 B2
(45) Date of Patent: Jun. 11, 2019

(54) WIDE-RANGE CLOCK SIGNAL GENERATION FOR SPEED GRADING OF LOGIC CORES

(71) Applicant: Mentor Graphics Corporation, Wilsonville, OR (US)

(72) Inventors: Shi-Yu Huang, Taoyuan (TW); Kun-Han Tsai, Lake Oswego, OR (US); Wu-Tung Cheng, Lake Oswego, OR (US); Tzu-Heng Huang, Kaohsiung (TW)

(73) Assignee: Mentor Graphics Corporation, Wilsonville, OR (US)

( * ) Notice: Subject to any disclaimer, the term of this patent is extended or adjusted under 35 U.S.C. 154(b) by 19 days.

(21) Appl. No.: 15/592,763

(22) Filed: May 11, 2017

(65) Prior Publication Data
US 2017/0328952 A1    Nov. 16, 2017

Related U.S. Application Data (60) Provisional application No. 62/337,260, filed on May 16, 2016.

(51) Int. Cl.
*G01R 31/3185* (2006.01)
*G01R 31/317* (2006.01)
*H03L 7/23* (2006.01)

(52) U.S. Cl.
CPC .......... *G01R 31/31727* (2013.01); *G01R 31/318552* (2013.01); *H03L 7/23* (2013.01)

(58) Field of Classification Search
CPC ............................................. G01R 31/318555
USPC ...................................................... 714/727
See application file for complete search history.

(56) References Cited

U.S. PATENT DOCUMENTS

| | | | | |
|---|---|---|---|---|
| 2004/0190085 A1* | 9/2004 | Silverbrook | ........ | G06F 3/03545 358/474 |
| 2010/0313089 A1* | 12/2010 | Rajski | ............ | G01R 31/318547 714/731 |
| 2013/0083611 A1* | 4/2013 | Ware | .................. | G11C 11/4072 365/191 |

OTHER PUBLICATIONS

X. Lin, R. Press, J. Rajski, P. Reuter, T. Rinderknecht, B. Swanson, and N. Tamarapalli, "High-Frequency, At-Speed Scan Testing," IEEE Design Test Computers, vol. 20, No. 5, pp. 17-25, Sep.-Oct. 2003.

H. Yan and A. D. Singh, "Experiments in Detecting Delay Faults using Multiple Higher Frequency Clocks and Result from Neighboring die," Proc. Int'l Test Conf., pp. 105-111, 2003.

J. Lee and E. J. McCluskey, "Failing Frequency Signature Analysis," Proc. Int'l Test Conf., pp. 1-8, 2008.

H.-J. Hsu, C.-C. Tu, and S.-Y. Huang, "Built-In Speed Grading with a Process-Tolerant ADPLL," Proc. Asian Test Symp., pp. 384-389, 2007.

(Continued)

*Primary Examiner* — Fritz Alphonse (57) ABSTRACT

An integrated circuit for on-chip speed grading comprises test circuitry comprising scan chains and a test controller; and wide-range clock signal generation circuitry comprising phase-locked loop circuitry and frequency divider circuitry. The wide-range clock signal generation circuitry is configured to generate a wide-range test clock signal for the test circuitry to conduct a structural delay test for on-chip speed grading. The wide-range test clock signal is generated based on a test clock signal associated with the test circuitry, a frequency range selection signal and a frequency setting signal.

14 Claims, 8 Drawing Sheets

(56) References Cited

OTHER PUBLICATIONS

A. Chandra, "Hot Topic On-Chip Clocking—Industrial Trends," Proc. of VLSI Test Symp., 2013.

T.-Y. Li, S.-Y. Huang, H.-J. Hsu, C.-W. Tzeng, C.-T. Huang, J.-J. Liou, H.-P. Ma, P.-C. Huang, J.-C. Bor, C.-C. Tien, and M. Wang, and C.-W. Wu, "AC-Plus Scan Methodology for Small Delay Testing and Characterization," IEEE Trans. on VLSI Systems (TVLSI), vol. 21, No. 2, pp. 329-341, Feb. 2013.

L. Y.-Z. Lin and C. H.-P. Wen, "Speed Binning with High-Quality Structural Patterns from Functional Timing Analysis (FTA)," Proc. of Asia and South Pacific Design Automation Conf,. pp. 238-243, 2016.

J. Zeng and M. Abadir, "On Correlating Structural Tests with Functional Tests for Speed Binning," Proc. of Current and Defect Based Testing, pp. 79-83, 2004.

N. Ahmed, M. Tehranipoor, and C. P. Ravikumar, "Enhanced Launch-off-Capture Transition Fault Testing", Proc. of Int'l Test Conf., pp. 246-255, 2005.

C.-W. Tzeng, S.-Y. Huang, P.-Y. Chao, and R.-T. Ding, "Parameterized All-Digital PLL Architecture and Its Compiler to Support Easy Process Migration," IEEE Trans. on VLSI Systems (TVLSI), vol. 22, No. 3, pp. 621-630, Mar. 2014.

G. Mrugalski, J. Rajski, J. Rybak, J. Solecki, and J. Tyszer, "A Deterministic BIST Scheme Based on EDT-Compressed Test Patterns," Proc. of Int'l Test Conf., pp. 1-8, 2015.

M. Beck, O. Barondeau, M. Kaibel, F. Poehl, X. Lin, and R. Press, "Logic Design for On-Chip Test Clock Generation—Implementation Details and Impact on Delay Test Quality," Proc. of Design Automation Test in Euro., pp. 56-61, 2005.

R. Press and J. Boyer, "Easily implement PLL Clock Switching for At-Speed Test," Chip Design Magazine, Feb.-Mar. 2006.

X. X. Fan, Y. Hu, and L. T. Wang, "An On-Chip Test Clock Control Scheme for Multi-Clock At-Speed Testing," Proc. Asian Test Symp., pp. 341-346, 2007.

"CIC Reference Flow for Cell-based IC Design", Chip Implementation Center, CIC, Taiwan, Document No. CIC-DSD-RD-08-01, 2008.

* cited by examiner

WIDE-RANGE CLOCK SIGNAL GENERATION FOR SPEED GRADING OF LOGIC CORES

RELATED APPLICATIONS

This application claims the benefit of U.S. Provisional Patent Application No. 62/337,260, filed on May 16, 2016, and naming Wu-Tung Cheng et al. as inventors, which application is incorporated entirely herein by reference.

FIELD OF THE DISCLOSED TECHNIQUES

The presently disclosed techniques relates to the field of circuit design, manufacture and testing. Various implementations of the disclosed techniques may be particularly useful for evaluating and testing manufactured circuit chips.

BACKGROUND OF THE DISCLOSED TECHNIQUES

The operating speed of a multi-core system-on-chip has become more difficult to decide due to process variation and operating conditions (such as temperature and supply noise). The best way to cope with this issue is to conduct a speed grading procedure and use the results to dynamically tune the supply voltage level and the operating speed for each individual logic core.

Speed grading (also known as speed binning) can be performed by running functional tests or structural delay tests repeatedly with changing clock frequencies. At the end of the process, the maximum operating speed of circuit under grading can be approximated successively. Efforts trying to correlate the results of these two types of test methods (functional vs. structural) have also been reported in J. Zeng and M. Abadir, "On Correlating Structural Tests with Functional Tests for Speed Binning," Proc. of Current and Defect Based Testing, pp. 79-83, 2004.

Since the functional test is too time-consuming, a hybrid method combining the benefits of both functional tests and structural tests appears to be more effective. In such a hybrid method, one can rely on on-chip built-in structural delay tests to gauge the maximum speed of a logic core, and then adjust it by a certain percentage to factor in the slack between the functional tests and structural tests derived by intensive correlation process.

In general, speed grading can be viewed as a search procedure to identify a maximum clock speed under which a logic core can still operate correctly while applying a set of test patterns based on a specific test method. During this procedure, clock frequency needs to be changed according to a specific search strategy—linear sweeping, binary search, or a mixed type. As a result, the clock signal generation for speed grading remains an important issue that has not been fully addressed. To ease the design process, it is also preferable that the overall speed grading circuitry can be made fully synthesizable. Moreover, a speed grading should be flexible enough to support a wide range of operating modes as a microprocessor design are often used in different applications with various power/performance trade-offs.

BRIEF SUMMARY OF THE DISCLOSED TECHNIQUES

Various aspects of the disclosed technology relate to techniques of using a wide-range clock signal generation scheme for speed grading. In one aspect, there is an integrated circuit for on-chip speed grading, comprising: test circuitry comprising scan chains and a test controller; and wide-range clock signal generation circuitry comprising phase-locked loop circuitry and frequency divider circuitry, the wide-range clock signal generation circuitry configured to generate a wide-range test clock signal for the test circuitry to conduct a structural delay test for on-chip speed grading, the wide-range test clock signal being generated based on a test clock signal associated with the test circuitry, a frequency range selection signal and a frequency setting signal.

The phase-locked loop circuitry may comprise a first phase-locked loop circuit and a second phase-locked loop circuit, and the frequency divider circuitry may comprise a first frequency divider and a second frequency divider, wherein the first phase-locked loop circuit generates a high speed clock signal based on the test clock signal, the first frequency divider generates a preliminary tunable clock signal based on the high speed clock signal and the frequency setting signal, the second phase-locked loop circuit generates a tunable clock signal based on the preliminary tunable clock signal, and the second frequency divider generates the wide-range clock signal based on the tunable clock signal and the frequency range selection signal.

The wide-range clock signal generation circuitry may further comprise final test clock signal generation circuitry, the final test clock signal generation circuitry combining the test clock signal with the wide-range clock signal to generate a final test clock signal, the final test clock signal being used by the scan-based test circuitry to conduct the structural delay test.

The structural delay test may use a launch-off-capture method. The test controller may comprise a pseudo-random test pattern generator, a decompressor for deterministic tests, or both. The test controller may comprise a speed grading controller configured to generate the frequency range selection signal and the frequency setting signal.

In another aspect, there are one or more non-transitory computer-readable media storing computer-executable instructions for causing one or more processors to create a system for on-chip speed grading in an electronic circuit design, the system for on-chip speed grading comprising: test circuitry comprising scan chains and a test controller; and wide-range clock signal generation circuitry comprising phase-locked loop circuitry and frequency divider circuitry, the wide-range clock signal generation circuitry configured to generate a wide-range test clock signal for the test circuitry to conduct a structural delay test for on-chip speed grading, the wide-range test clock signal being generated based on a test clock signal associated with the test circuitry, a frequency range selection signal and a frequency setting signal.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to techniques of using a wide-range clock signal generation scheme for speed grading. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Speed Grading

Speed Grading is referred to a executable procedure aimed at deriving the maximum operating speed of a circuit-under-test (CUT) under a practical set of test conditions. The derived maximum operating speed is herein denoted as $F_{MAX}$. Speed grading can be conducted for the purpose of silicon validation during an offline manufacturing test, or conducted in the field for dynamic voltage and frequency tuning.

To grade the speed for a circuit-under-test, three important elements should be decided: the test method, including the test patterns and the test application scheme; the clocking scheme; and the search strategy. In the first element (i.e., the test method), one needs to decide if functional patterns or structural patterns are to be used. To support Power-On Self-Test (POST) in the field, these patterns need to be stored on the chip in non-volatile memory in advance, or in another die (or chip) packaged with the circuit-under-test. If structural test patterns are to be used, one needs to further decide what delay test scheme is to be used—e.g., Launch-off-Shifting (LoS) or Launch-off-Capture (LoC). Each test method is affiliated with its own special test clock signal.

In the second element (i.e., the clock scheme), one needs to come up with a plan of how to generate the clock signal, and how to apply the clock signal to the circuit-under-test. For example, if there is a high-speed I/O pad for the circuit-under-test, one can apply the potentially high-speed test clock signal from an external ATE (Automatic Test Equipment). Nevertheless, this clock scheme is only good for speed grading during the manufacturing test, not for in-the-field operation.

In the third element (i.e., the search strategy), one needs to decide a procedure such that the maximum operating speed of the circuit-under-test can be successively approximated. For example, one can use a simple linear search method (also known as sweeping method) that gradually increases the clock frequency from a low value to a high value within a target search frequency window, and the maximum operating speed of the circuit-under-test can thereby be derived by identifying the last frequency when the test yields a "passing" result. Since such a linear search method is often unnecessarily too time-consuming, a binary search is often employed to speed it up. Nevertheless, a binary search itself may suffer from accuracy loss due to the fluctuations of test results as each test iteration might have a different operating condition. Hence, a hybrid method uses a "binary search with local sweeping" to make the speed grading more efficiently while not losing any accuracy as compared to the sweeping method.

Figure 1:
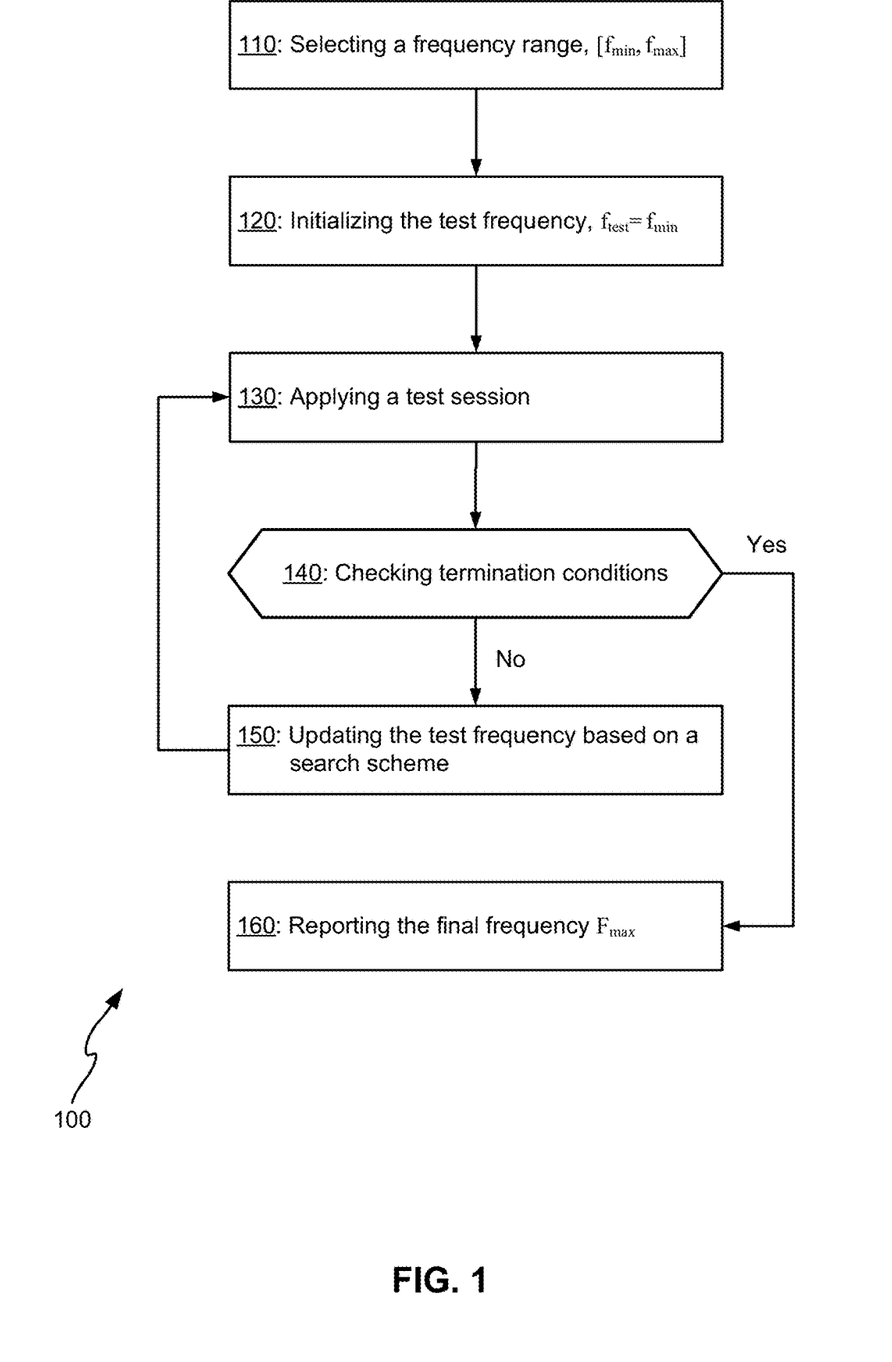
FIG. 1 illustrates an example of a speed grading flow.

FIG. 1 illustrates an example of a speed grading flow 100. First, the on-chip controller selects a test frequency range in operation 110, denoted as $[f_{min}, f_{max}]$, and the initial test frequency in operation 120, e.g., setting $f_{test}=f_{min}$. Then, the flow enters a loop (operations 130-150). At each iteration of the loop, the test patterns are produced to test the circuit-under-test at the current test frequency in operation 130. At the end, the test results are checked in operation 140 and analyzed so that the next test frequency can be updated in operation 150. When reaching the termination condition of a search strategy, the maximum operating speed of the circuit-under-test, denoted as $F_{max}$, is inferred and reported in operation 160.

Figure 2:
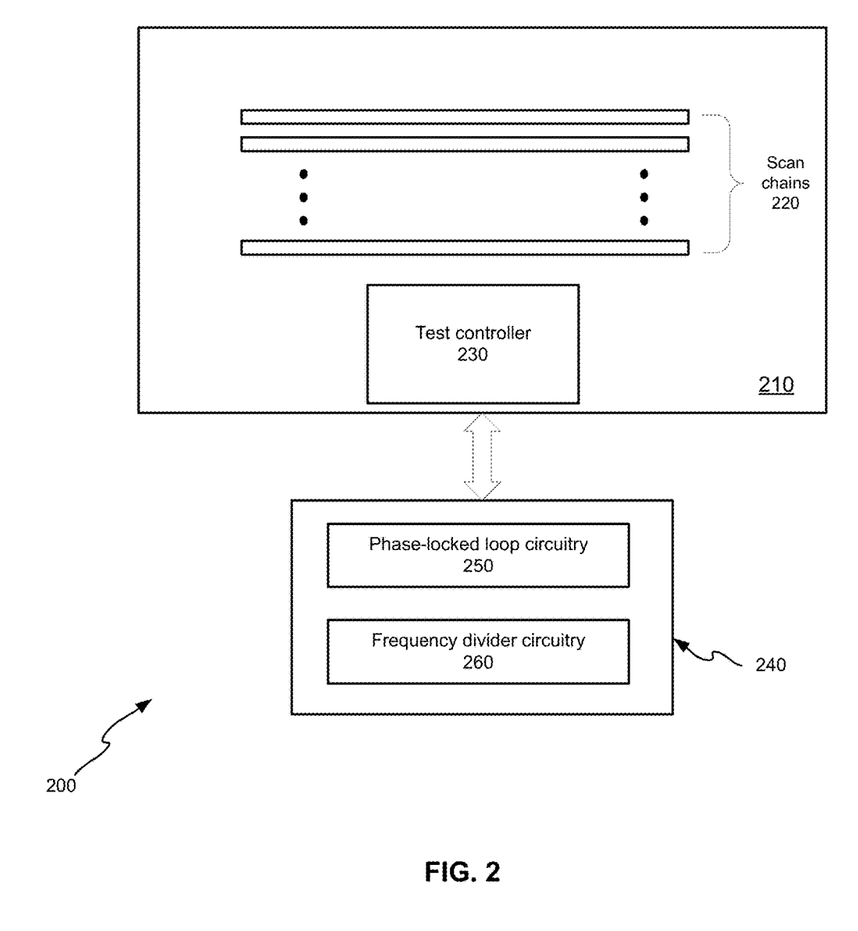
FIG. 2 illustrates an example of circuit architecture according to various embodiments of the disclosed technology.

FIG. 2 illustrates an example of circuit architecture according to various embodiments of the disclosed technology. A circuit 200 shown in the figure includes test circuitry 210 configurable to perform a speed grading test, and wide-range clock signal generation circuitry 240 that can generate a wide-range test clock signal for the speed grading test. The test circuitry 210 includes a test controller 230 and scan chains 220. The scan chains 220 can shift in test stimuli, apply the test stimuli to the circuit-under-test, and capture the test responses. Primary inputs may also be used to inject test stimuli into the circuit-under-test. The test controller 230 may comprise a pseudo-random test pattern generator, a decompressor for applying stored deterministic test patterns, or both. The speed grading test employs a structural delay test which will be discussed in detail below.

The wide-range clock signal generation circuitry 240 includes phase-locked loop circuitry 250 and frequency divider circuitry 260. The phase-locked loop circuitry 250 can multiply the frequency of a clock signal by a certain number of times. The frequency divider circuitry 260 can divide the frequency of a clock signal by a certain number of times. The phase-locked loop circuitry 250 and the frequency divider circuitry 260 work together to generate a wide-range test clock signal for a structural delay test conducted by the test circuitry based on a test clock signal associated with the test circuitry, a frequency range selection signal and a frequency setting signal. The test clock signal may be generated based on a system clock signal. The frequency range selection signal selects the test frequency range (operation 110 of the flowchart 100), and the frequency setting signal sets the current test frequency (operation 130 of the flowchart 100) and sweeps across the test frequency range. The frequency range selection signal and the frequency setting signal may be supplied by the test controller 230. Both the phase-locked loop circuitry 250 and the frequency divider circuitry 260 can be all digital and fully synthesizable. An example of all-digital phased-locked loop circuitry is disclosed in Hsu, Hsuan-Jung et al., "Built-in speed grading with a process-tolerant ADPLL," Proc. Asian Test Symp., pp. 384-389, 2007, which is incorporated herein by reference. The frequency divider circuitry 260 may comprise one or more counter-based frequency divider.

Figure 3:
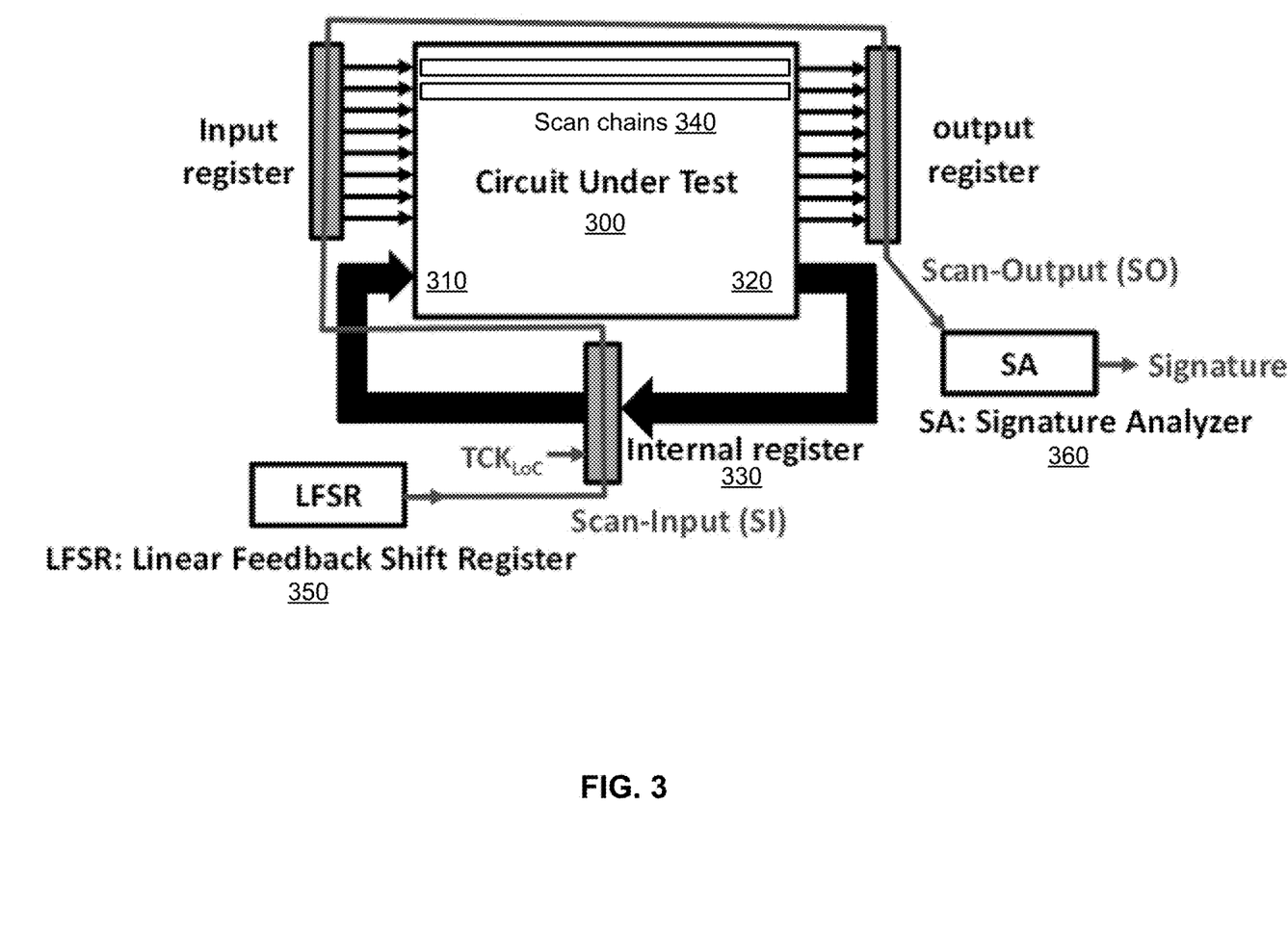
FIG. 3 illustrates an example of the test circuitry that can be used for speed grading.

FIG. 3 illustrates an example of the test circuitry. The circuit-under-test is represented as a Hoffman model, with primary inputs 310, primary outputs 320, internal registers and the combination logic (not shown explicitly). Registers 330 are added to the primary inputs 310 and primary outputs 320, on the consideration that there is no external ATE to drive them when the built-in speed grading test is performed. Therefore, they are included in the scan chain(s) 340 like the other internal registers for easy test pattern application. In general, there could be more than one scan chains.

In addition, a linear-feedback shift-register based pseudo random pattern generator 350 is added to provide random bit-stream(s) feeding the scan chain(s) 340. At the end of the application of one random pattern, the output(s) of scan chain(s) 340 are fed to a signature analyzer 360 which will compress all responses captured throughout an entire test session into a final signature. Pass-or-fail decision is made by comparing this compressed signature with a pre-stored golden signature. The test clock signal driving the clock ports of all scan cells are particularly labeled as $TCK_{LOC}$. How to generate this test clock signal will be discussed in detail later.

Figure 4:
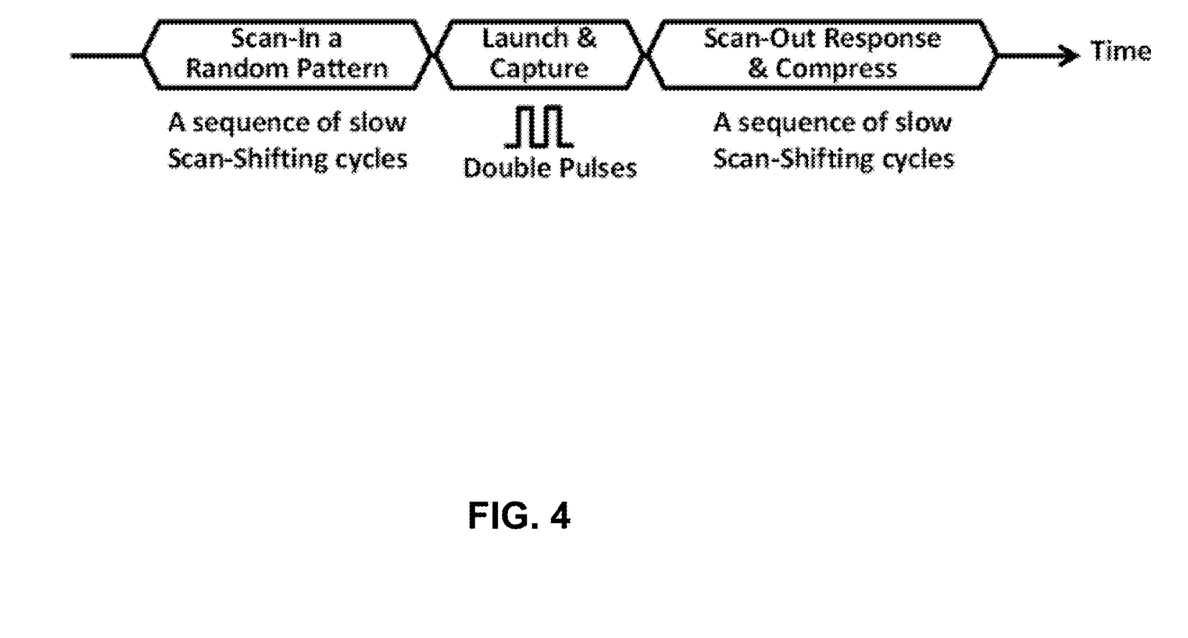
FIG. 4 shows an example of an application flow of one random pattern for the structural delay test.

FIG. 4 shows an example of an application flow of one random pattern for the structural delay test. The flow uses launch-off-capture-based structural test patterns generated by a pseudo random pattern generator (e.g., the linear-feedback shift-register 350). It should be appreciated by a person of ordinary skill in the art that the flow may instead use deterministic BIST patterns or by ATPG patterns stored on the chip. The flow is divided into three stages: (1) scan-in a random pattern using a sequence of slow scan-shifting cycles; (2) launch-and-capture operation using two high-speed double pulses; and (3) scan-out the response stored in scan chain(s) to the signature analyzer through a sequence of slow scan-shifting cycles and the signature compression is performed on the fly.

Figure 5:
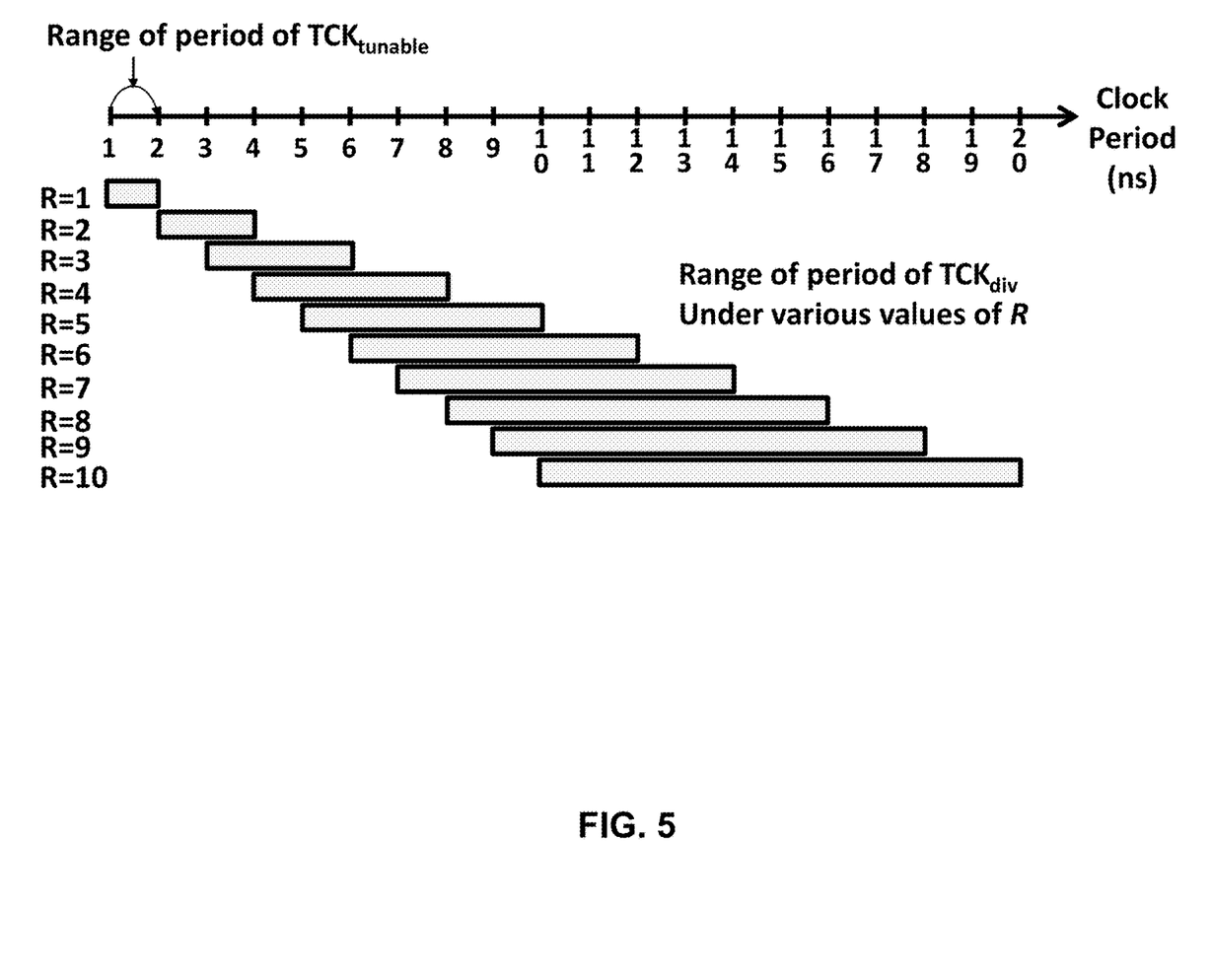
FIG. 5 illustrates an example of how $TCK_{LOC}$ supporting speed grading using launch-off-capture type of test may be generated based on an original slow test clock signal TCK by the wide-range clock signal generation circuitry.

FIG. 5 illustrates an example of how $TCK_{LOC}$ supporting speed grading using launch-off-capture type of test may be generated based on an original slow test clock signal TCK by the wide-range clock signal generation circuitry 240. The original slow test clock signal (e.g., 10 MHz) may be used to generate a high-speed 1 GHz clock signal $TCK_{1G}$. Next, a high-speed tunable clock signal, denoted as $TCK_{tunable}$, may be generated based on $TCK_{1G}$. The frequency of $TCK_{tunable}$ is between [500 MHz, 1 GHz]. If the inverse of its frequency is taken as a clock period $T_{tunable}$, then $T_{tunable}$ can take on one out of 101 possible values in a range of [1 ns, 2 ns] with a step resolution of 10 ps. The exact value of $T_{tunable}$ is determined by a 7-bit tuning code, say $\alpha[6:0]$. To be more specific, $T_{tunable}$ increases from 1 ns, 1.10 ns, to 2 ns gradually when a[6:0] increases from 0 to 100.

Next, a wide-range clock signal, denoted as $TCK_{div}$, whose frequency is that of the tunable clock signal $TCK_{tunable}$ divided by R, where R is an integer roughly in a range of [1, 10]. Since $TCK_{tunable}$ represents one of a family of 100 clock signals, so does its divided clock signal under a value of R. The frequency ranges of this divided clock signal $TCK_{div}$ under different values of R are shown in FIG. 5. In general, this divided clock signal spreads out the period range of the tunable high-speed clock signal from [1 ns, 2 ns] to a much wider range such as [1 ns, 20 ns]. In other words, the frequency range of $TCK_{div}$ is as large as [50 MHz, 1 GHz]. It can thus be used to support many kinds of speed grading applications, including those running at a low supply voltage to achieve low power consumption.

A final test clock signal denoted as $TCK_{LOC}$ is generated based on the original slow test clock TCK and the wide-range divided clock signal $TCK_{div}$. $TCK_{LOC}$ is supplied to the clock port of a logic core under speed grading. In general, this final test clock can be produced by multiplexing the original slow test clock TCK and the wide-range divided clock signal $TCK_{div}$, as discussed in e.g., R. Press and J. Boyer, "Easily implement PLL Clock Switching for At-Speed Test," Chip Design Magazine, February-March 2006, and X. X. Fan, Y. Hu, and L. T. Wang, "An On-Chip Test Clock Control Scheme for Multi-Clock At-Speed Testing," Proc. Asian Test Symp., pp. 341-346, 2007.

Figure 6:
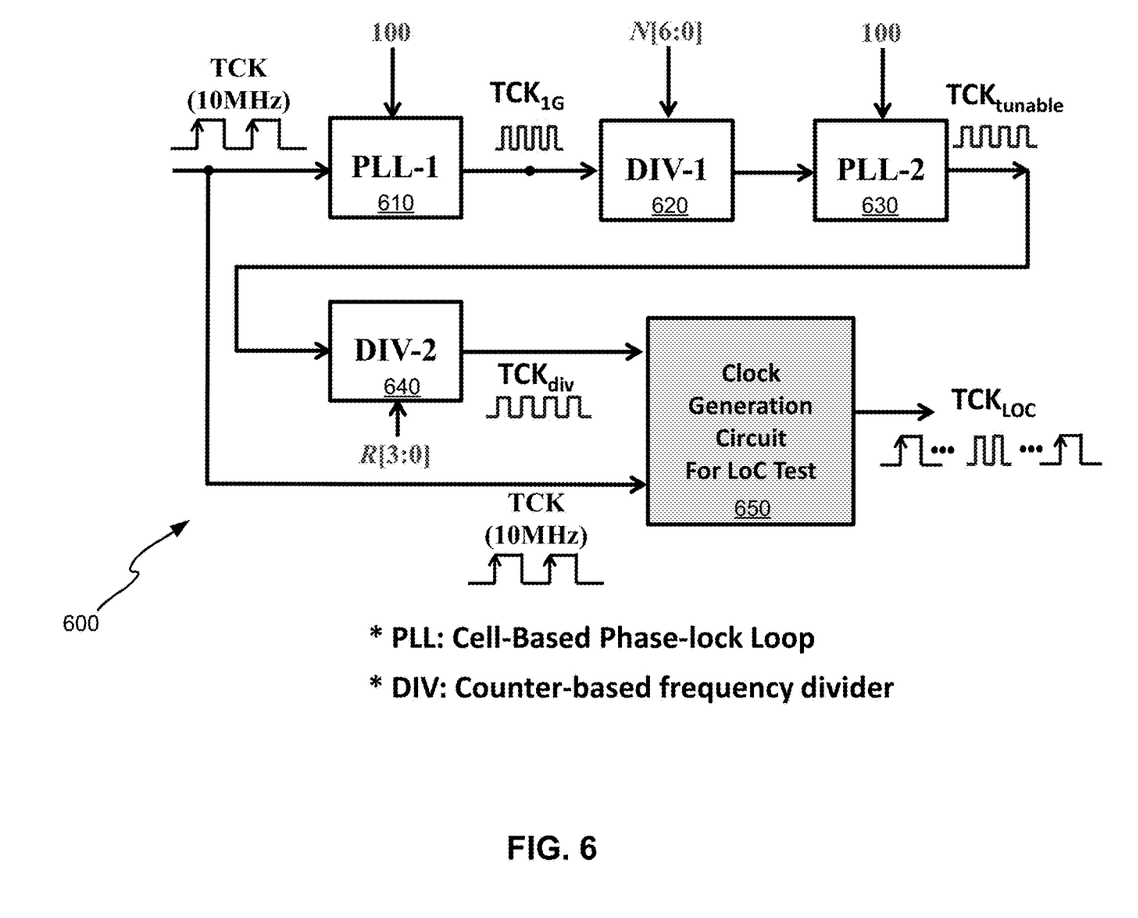
FIG. 6 shows an example of a block diagram of the wide-range clock signal generation circuitry according to various embodiments of the disclosed technology.

FIG. 6 shows an example of a block diagram of the wide-range clock signal generation circuitry according to various embodiments of the disclosed technology. The wide-range clock signal generation circuitry 600 generates the clock signals shown in FIG. 5 in stages. The input is 10 MHz TCK, and the final output is $TCK_{LOC}$. A cell-based Phase-Locked Loop (PLL) 610, named PLL-1, multiplies the frequency of TCK by 100 times to produce 1 GHz $TCK_{1G}$. A frequency divider 620, named DIV-1, then divides the frequency of 1 GHz $TCK_{1G}$ by N, where N is a positive integer in a range of [100, 200], producing a clock signal called $TCK_{temp}$. A second PLL 630, named PLL-2, boosts the frequency of $TCK_{temp}$ by 100 times, producing the desired clock signal $TCK_{tunable}$.

The clock period of $TCK_{tunable}$ is a function of N and can be derived as follows: Period($TCK_{temp}$)=Period($TCK_{1G}$)*N=1*N=N (ns) and Period($TCK_{tunable}$)=Period($TCK_{temp}$)/100=N/100 (ns). When the value of N increases from 100, 101, 102, . . . , to 200 gradually, the clock period of the produced clock signal $TCK_{tunable}$ increases from 1 ns, 1.10 ns, 1.02 ns, . . . , to 2 ns, as desired. Since the smallest period is 1 ns and the tunable resolution is 0.01 ns, the tuning resolution percentage can be calculated as (0.01 ns)/1 ns=1%.

A second frequency divider 640, named DIV-2, divides the frequency of $TCK_{tunable}$ by R[3:0], where R is a range selector mentioned earlier, a positive integer in a range of [1, 10]. The output of this component is $TCK_{div}$. Once $TCK_{div}$ is ready, a clock generation circuit for launch-off-capture type of delay test 650 is used to produce the final test clock signal $TCK_{LOC}$, which is basically a mixture of slow TCK and the higher-speed $TCK_{div}$. During the scan-shifting cycles, $TCK_{LOC}$ follows TCK. On the other hand, during the "launch-and-capture cycle", it follows the higher-speed $TCK_{div}$ and produces two pulses.

The flow chart 200, in particular the preparation part, may be revised slightly to perform speed grading. Once the speed grading is started, a frequency range is selected by determining the value of the range selector, i.e., R[3:0]. Then, the test frequency is initialized to the minimum value in that range by setting N[6:0] to 100. After that, a procedure to operate PLL-1 610 and PLL-2 630 in sequence is executed until they are both stable. Note that this is often necessary since it takes some time for a PLL to settle down to a target output frequency. When this is complete, an output signal of the PLL will be asserted to signal a steady-state condition, and then the speed grading flow can proceed to the next step. Once a test clock signal $TCK_{LOC}$ of a specific test frequency is stable, the test controller can issue a test session. Based on the results of the test session, a new test frequency is updated by setting a new value to N[6:0] following a underlying search strategy. When the entire search process is complete, maximum operating speed $F_{max}$ of the circuit is reported.

Figure 7:
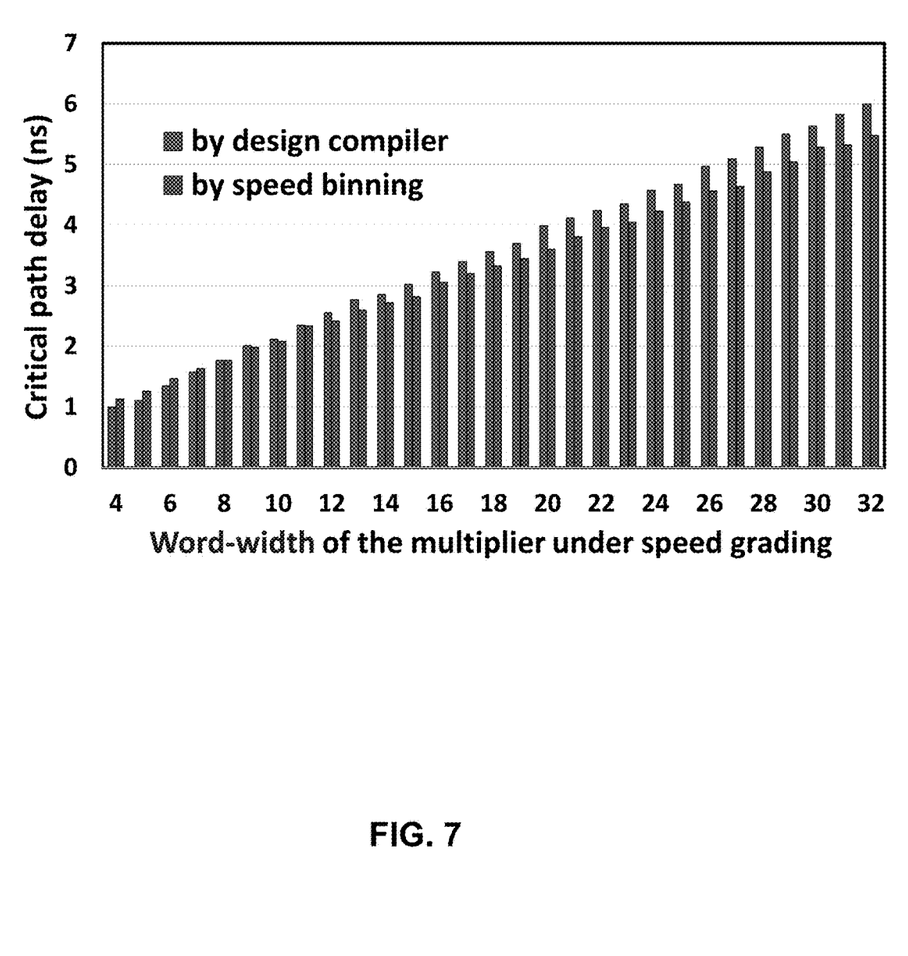
FIG. 7 shows an example of simulated speed grading results compared with those derived by Design Compiler.

FIG. 7 shows an example of simulated speed grading results compared with those derived by Design Compiler. The circuit-under-test is formed by a series of multipliers synthesized by Design Compiler according to "by reference", Chip Implementation Center, CIC, Taiwan, Document no. CIC-DSD-RD-08-01, 2008. The word-width varies from 4 to 32. The critical path delays reported are from roughly 1 ns to 6 ns. As it can be seen from the figure, there is a close correlation between the simulated results and those derived by Design Compiler. To reduce the validation time, only 100 random pattern are applied in these experiments. When performed in real silicon, much more patterns can be applied to generate more convincing results.

Illustrative Operating Environment

Various examples of the disclosed technology may be implemented through the execution of software instructions by a computing device such as a programmable computer. The software instructions may be stored on a non-transitory computer-readable medium. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

Figure 8:
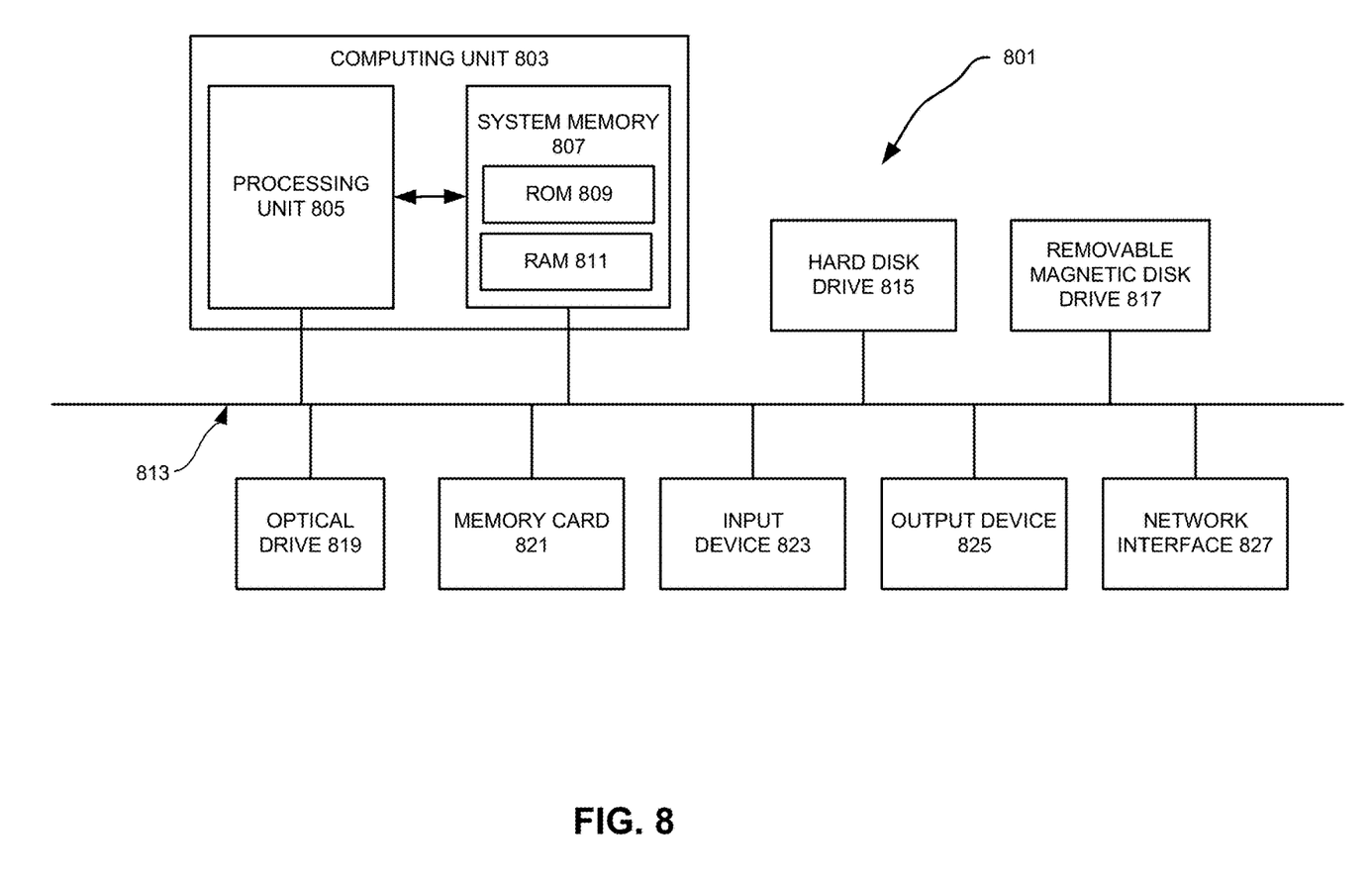
FIG. 8 illustrates a programmable computer system with which various embodiments of the disclosed technology may be employed.

The execution of software instructions will modify a circuit design to create test circuitry and wide-range clock signal generation circuitry such as those shown in FIG. 2. Accordingly, FIG. 8 shows an illustrative example of a computing device 801. As seen in this figure, the computing device 801 includes a computing unit 803 with a processing unit 805 and a system memory 807. The processing unit 805 may be any type of programmable electronic device for executing software instructions, but will conventionally be a microprocessor. The system memory 807 may include both a read-only memory (ROM) 809 and a random access memory (RAM) 811. As will be appreciated by those of ordinary skill in the art, both the read-only memory (ROM) 809 and the random access memory (RAM) 811 may store software instructions for execution by the processing unit 805.

The processing unit 805 and the system memory 807 are connected, either directly or indirectly, through a bus 813 or alternate communication structure, to one or more peripheral devices. For example, the processing unit 805 or the system memory 807 may be directly or indirectly connected to one or more additional memory storage devices, such as a "hard" magnetic disk drive 815, a removable magnetic disk drive 817, an optical disk drive 819, or a flash memory card 821. The processing unit 805 and the system memory 807 also may be directly or indirectly connected to one or more input devices 823 and one or more output devices 825. The input devices 823 may include, for example, a keyboard, a pointing device (such as a mouse, touchpad, stylus, trackball, or joystick), a scanner, a camera, and a microphone. The output devices 825 may include, for example, a monitor display, a printer and speakers. With various examples of the computer 801, one or more of the peripheral devices 815-825 may be internally housed with the computing unit 803. Alternately, one or more of the peripheral devices 815-825 may be external to the housing for the computing unit 803 and connected to the bus 813 through, for example, a Universal Serial Bus (USB) connection.

With some implementations, the computing unit 803 may be directly or indirectly connected to one or more network interfaces 827 for communicating with other devices making up a network. The network interface 827 translates data and control signals from the computing unit 803 into network messages according to one or more communication protocols, such as the transmission control protocol (TCP) and the Internet protocol (IP). Also, the interface 827 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 801 is illustrated as an example only, and it not intended to be limiting. Various embodiments of the disclosed technology may be implemented using one or more computing devices that include the components of the computer 801 illustrated in FIG. 8, which include only a subset of the components illustrated in FIG. 8, or which include an alternate combination of components, including components that are not shown in FIG. 8. For example, various embodiments of the disclosed technology may be implemented using a multi-processor computer, a plurality of single and/or multiprocessor computers arranged into a network, or some combination of both.

CONCLUSION

While the disclosed techniques has been described with respect to specific examples including presently preferred modes of carrying out the disclosed techniques, those skilled in the art will appreciate that there are numerous variations and permutations of the above described systems and techniques that fall within the spirit and scope of the disclosed techniques as set forth in the appended claims. For example, while specific terminology has been employed above to refer to electronic design automation processes, it should be appreciated that various examples of the disclosed techniques may be implemented using any desired combination of electronic design automation processes.

What is claimed is:

1. An integrated circuit, comprising:
   test circuitry comprising scan chains and a test controller; and
   wide-range clock signal generation circuitry comprising phase-locked loop circuitry and frequency divider circuitry, the wide-range clock signal generation circuitry configured to generate a wide-range test clock signal for the test circuitry to conduct a structural delay test for on-chip speed grading, the wide-range test clock signal being generated based on a test clock signal associated with the test circuitry, a frequency range selection signal and a frequency setting signal.

2. The integrated circuit recited in claim 1, wherein the phase-locked loop circuitry comprises a first phase-locked loop circuit and a second phase-locked loop circuit, and the frequency divider circuitry comprises a first frequency divider and a second frequency divider, wherein the first phase-locked loop circuit generates a high speed clock signal based on the test clock signal, the first frequency divider generates a preliminary tunable clock signal based on the high speed clock signal and the frequency setting signal, the second phase-locked loop circuit generates a tunable clock signal based on the preliminary tunable clock signal, and the second frequency divider generates the wide-range clock signal based on the tunable clock signal and the frequency range selection signal.

3. The integrated circuit recited in claim 1, wherein the wide-range clock signal generation circuitry further comprises:
   final test clock signal generation circuitry, the final test clock signal generation circuitry combining the test clock signal with the wide-range clock signal to generate a final test clock signal, the final test clock signal being used by the scan-based test circuitry to conduct the structural delay test.

4. The integrated circuit recited in claim 1, wherein the structural delay test uses a launch-off-capture method.

5. The integrated circuit recited in claim 1, wherein the test controller comprises a pseudo-random test pattern generator.

6. The integrated circuit recited in claim 1, wherein the test controller comprises a decompressor for deterministic tests.

7. The integrated circuit recited in claim 1, wherein the test controller comprises a speed grading controller configured to generate the frequency range selection signal and the frequency setting signal.

8. One or more non-transitory computer-readable media storing computer-executable instructions, that, when executed, cause a computer to create a system for on-chip speed grading in an electronic circuit design by:
   creating test circuitry comprising scan chains and a test controller; and
   creating wide-range clock signal generation circuitry comprising phase-locked loop circuitry and frequency divider circuitry, the wide-range clock signal generation circuitry configured to generate a wide-range test clock signal for the test circuitry to conduct a structural delay test for on-chip speed grading, the wide-range test clock signal being generated based on a test clock signal associated with the test circuitry, a frequency range selection signal and a frequency setting signal.

9. The one or more computer-readable media recited in claim 8, wherein the phase-locked loop circuitry comprises a first phase-locked loop circuit and a second phase-locked loop circuit, and the frequency divider circuitry comprises a first frequency divider and a second frequency divider, wherein the first phase-locked loop circuit generates a high speed clock signal based on the test clock signal, the first frequency divider generates a preliminary tunable clock signal based on the high speed clock signal and the frequency setting signal, the second phase-locked loop circuit generates a tunable clock signal based on the preliminary tunable clock signal, and the second frequency divider generates the wide-range clock signal based on the tunable clock signal and the frequency range selection signal.

10. The one or more non-transitory computer-readable media recited in claim 8, wherein the wide-range clock signal generation circuitry further comprises:
    final test clock signal generation circuitry, the final test clock signal generation circuitry combining the test clock signal with the wide-range clock signal to generate a final test clock signal, the final test clock signal being used by the scan-based test circuitry to conduct the structural delay test.

11. The one or more non-transitory computer-readable media recited in claim 8, wherein the structural delay test uses a launch-off-capture method.

12. The one or more non-transitory computer-readable media recited in claim 8, wherein the test controller comprises a pseudo-random test pattern generator.

13. The one or more non-transitory computer-readable media recited in claim 8, wherein the test controller comprises a decompressor for deterministic tests.

14. The one or more non-transitory computer-readable media recited in claim 8, wherein the test controller comprises a speed grading controller configured to generate the frequency range selection signal and the frequency setting signal.

* * * * *